United States Patent [19]

Shimazaki

[11] Patent Number: 4,577,945

[45] Date of Patent: Mar. 25, 1986

[54] PATTERN TRANSFER DEVICE AND METHOD

[75] Inventor: Kuniya Shimazaki, Kawasaki, Japan

[73] Assignee: Tokyo Shibaura Denki Kabushiki Kaisha, Kawasaki, Japan

[21] Appl. No.: 578,815

[22] Filed: Feb. 10, 1984

[30] Foreign Application Priority Data

Feb. 14, 1983 [JP] Japan .................................. 58-22511

[51] Int. Cl.⁴ .............................................. G03B 3/10
[52] U.S. Cl. ...................................... 353/101; 353/28
[58] Field of Search ..................... 353/101, 28; 355/52, 355/53, 56; 33/180 R; 350/253, 255; 29/829

[56] References Cited

U.S. PATENT DOCUMENTS

| | | | |
|---|---|---|---|
| 3,744,902 | 7/1973 | Henker | 33/174 TD |
| 4,140,392 | 2/1979 | Lacombat et al. | 355/53 X |
| 4,155,692 | 5/1979 | Lacombat | 355/53 |
| 4,190,325 | 2/1980 | Moreno | 350/253 |
| 4,383,757 | 5/1983 | Phillips | 355/53 |
| 4,414,749 | 11/1983 | Johannsmeier | 33/180 R |
| 4,420,233 | 12/1983 | Nomoto et al. | 353/101 X |

OTHER PUBLICATIONS

E. W. Loebach, "VLSI Wafer Printing with Step-and Repeat Aligners", IGC Conference, Sep. 1979.

Primary Examiner—Harry N. Haroian
Attorney, Agent, or Firm—Schwartz, Jeffery, Schwaab, Mack, Blumenthal & Evans

[57] ABSTRACT

For the manufacture of photomasks or in order to draw a pattern on a semiconductor wafer, a step-and-repeat procedure is used. In a step-and-repeat pattern transfer device, the length of a lens barrel 1 is varied so that the reduction of a pattern original 5 is finely adjusted so that the size errors of the pattern may be corrected. The fine adjustment of the reduction is made to such an extent that the expansion of the semiconductor wafer or the like may be compensated for. In order to vary the length of the lens barrel 1, an adjustment means such as a piezoelectric element or electric motor is incorporated in the lens barrel.

7 Claims, 10 Drawing Figures

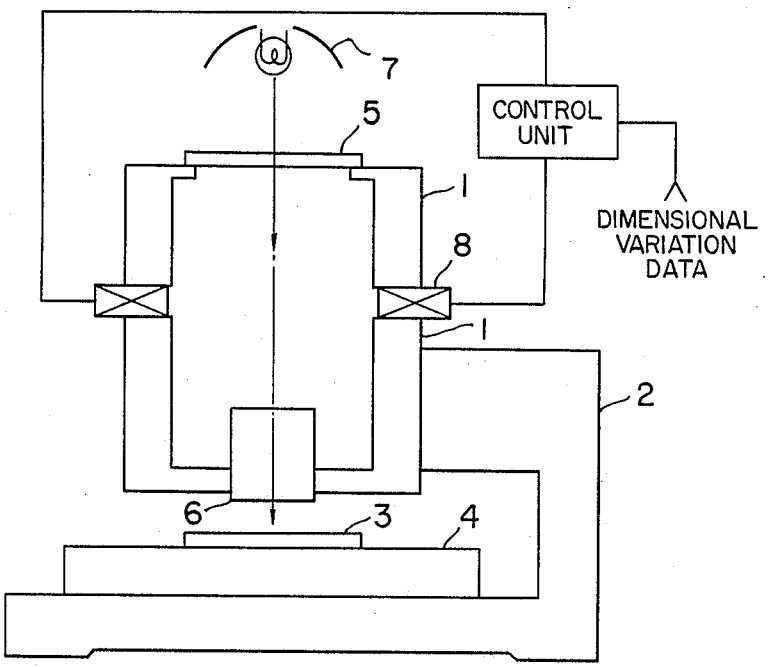

PATTERN TRANSFER DEVICE AND METHOD

BACKGROUND OF THE INVENTION

1. Field of the Invention

The present invention relates to a step-and-repeat pattern transfer device and method for preparing masks or drawing a pattern directly over the surface of a semiconductor wafer.

2. Technical Background of the Invention

According to a step-and-repeat pattern transfer method, an original image is focused over an object through a high resolving power lens so as to prepare photomasks or draw patterns over the surfaces of semiconductor wafers.

In this case, due to the thermal treatment or the like, the sizes of a semiconductor wafer vary, but the reduction of a high resolving power lens cannot be varied.

Therefore, there has been employed a method for varying the distance over which is stepped a focused image or cooling an object so as to reduce its size. In view of a time factor, the former is more practical, but accurate corrections cannot be made.

OBJECT OF THE INVENTION

The present invention was made to overcome the above and other problems encountered in the prior art step-and-repeat pattern transfer devices and methods and has for its object to provide a device and method for manufacture of semiconductor devices in which alignment or registration between patterns transferred over the surface of a wafer or the like by the step-and-repeat procedure can be improved and deviations of a pattern can be reduced to a minimum.

SUMMARY OF THE INVENTION

To the above and other ends, the present invention provides a device and method for manufacture of semiconductor devices in which a prior art device and method for reducing and focusing an original image by a step-and-repeat procedure so as to prepare a photomask or draw a pattern over the surface of a semiconductor device is provided with a reduction ratio control means for making fine adjustment of the reduction ratio of an original image so that the sizes of each pattern can be corrected.

BRIEF DESCRIPTION OF THE DRAWINGS

FIG. 3 is a view used to explain the construction of a first embodiment of the present invention;

FIGS. 4(a) and 4(b) are top views of a mask prepared by the device as shown in FIG. 3;

DETAILED DESCRIPTION OF THE INVENTION

Figure 1:
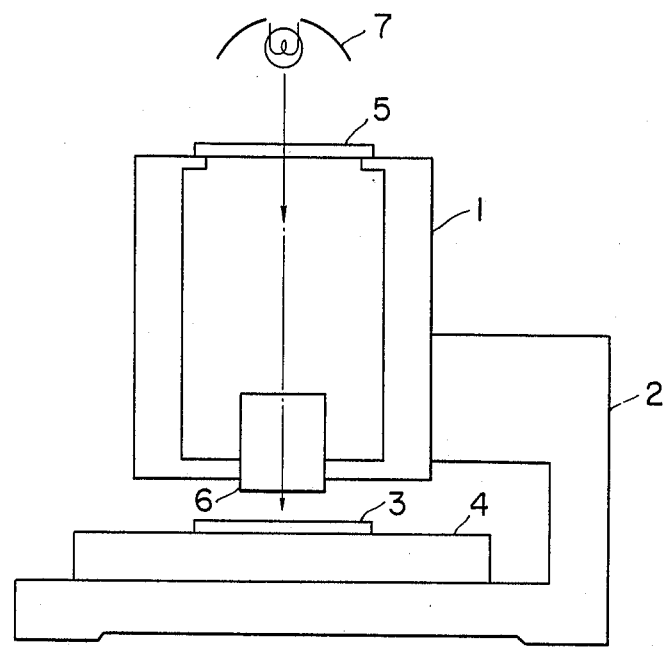
FIG. 1 is a view used to explain the construction of a prior art device.

Prior to the description of the preferred embodiments of the present invention, a prior art device will be described with reference to FIGS. 1, 2(a) and 2(b).

A prior art step-and-repeat device and method will be described with reference to FIGS. 1, 2(a) and 2(b). FIG. 1 is a view used to explain the construction of the prior art device. A lens barrel 1 is securely mounted on a stand 2 and a main table 4 upon which is mounted a mask 3 is disposed below the stand 2. An original 5 is disposed at the upper end of the lens barrel 1 while a projection lens 6 is mounted at the lower end thereof. When the light is projected toward the original 5 from a light source 7 which is disposed upwardly of the original 5, the pattern or image on the original 5 is focused through the projection lens 6 over the mask 3.

Figure 2A:
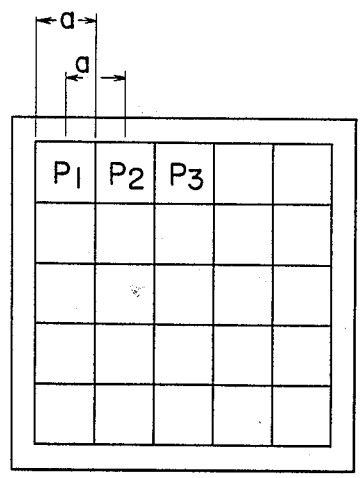
FIGS. 2(a) and (b) are top views of a mask prepared by the device as shown in FIG. 1.
Figure 2B:
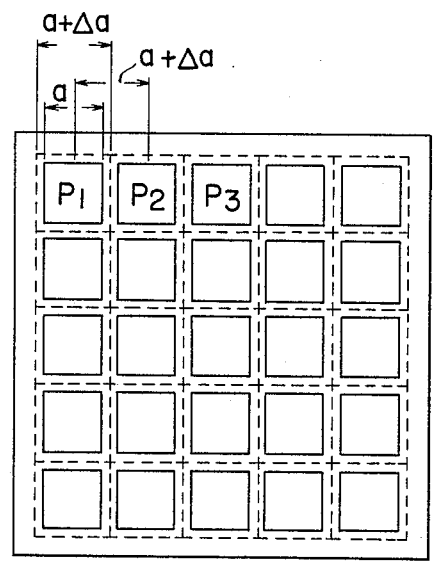

FIGS. 2(a) and 2(b) show a top view of a mask prepared by the device as shown in FIG. 1. The original 5 is magnified by five or ten times (this magnification ratio is fixed) and is, in turn, reduced through the projection lens 6 to 1/5 or 1/10 (the reduction ratio is also fixed). The reduced image is focused upon a predetermined portion (for instance at $P_1$ in FIG. 2(a)) of the mask 3. Every time when the image is focused, the main table 4 is stepped (by a distance a in FIG. 2(a)), whereby patterns are successively transferred. (For instance, the patterns are transferred in the order of $P_1$, $P_2$, $P_3$ and so on in FIG. 2(a)).

PROBLEMS OF THE PRIOR ART

The process for manufacture of semiconductor devices include a heat treatment step so that thermal deformations and shrinkage of wafers results. As a result, the position and size of a pattern transferred on a wafer deviate from a desired position and a desired size. In the past, this "deviation" has been very small so that the size of one pattern, that is, the pattern transfer reduction is not changed. Instead the positions where the patterns are focused, that is, the step size is varied in response to the enlargement or reduction of the wafer.

This will be described with reference to FIG. 2(b). It is assumed that the patterns are transferred by the step-and-repeat reduction as shown in FIG. 2(a) and that because of heat treatment, the mask 3 is deformed as shown in FIG. 2(b). Then as indicated by the broken lines, each pattern with a side a changes to a pattern with a side $a+\Delta a$. Therefore in the next step for transferring a pattern by the step-and-repeat procedure, the step a is changed to the step $a+\Delta a$. Thus the patterns are transferred in the order of $P_1$, $P_2$, $P_3$ and so on as shown by the solid lines in FIG. 2(b).

When the "deviations" of patterns are corrected only by changing the step without changing the size of the pattern, all the patterns are not same in size so that the problems in characteristics and performance of the semiconductor devices result. These problems are very serious especially in the case of the manufacture of very large scale integration systems.

EMBODIMENTS OF THE INVENTION

A first embodiment of the present invention will be described with reference to FIGS. 3, 4(a) and 4(b). FIG. 3 is a view used to explain the construction of the first embodiment and same reference numerals are used to designate similar parts throughout the figures. A control mechanism 8 is interposed between the upper and lower halves of the lens barrel 1 so that the length of the barrel 1 can be varied and consequently the reduction can be finely adjusted. According to the prior art, the length of the lens barrel remains unchanged because if the length is varied, the characteristics of the high resolving power lens are adversely affected, but according to the experiments conducted by the inventors it is confirmed that no adverse effect will occur even when the length of the lens barrel is varied by 0.1%. The control mechanism 8 may be a piezoelectric element which changes its thickness when applied with a voltage or a motor and cam mechanism. By changing the length of the lens barrel, the size of a pattern focused on the mask 3 mounted on the main table 4 is varied or adjusted.

FIGS. 4(a) and 4(b) show a top view of a mask prepared by the device as shown in FIG. 3. First, by the step-and-repeat reduction procedure, the patterns are transferred on the mask 3 as shown in FIG. 4(a). Next when the mask 3 is subjected to a heat treatment, it is deformed. The rate of shrinkage due to heat treatment is previously obtained so that in response to the rate of shrinkage the rate of reduction is varied by increasing or decreasing the length of the lens barrel 1 by the control mechanism 8. Every time one pattern is transferred, the main table 4 and hence the mask 3 are successively stepped as indicated by $P_1$, $P_2$, $P_3$ and so on. Therefore, patterns whose "deviations" are minimized can be obtained as shown in FIG. 4(b).

In order to vary the rate of reduction in the case of pattern transfer, the position of the projection lens or the original may be varied. Alternatively, a zoom lens may be used as a projection lens.

Figure 5:
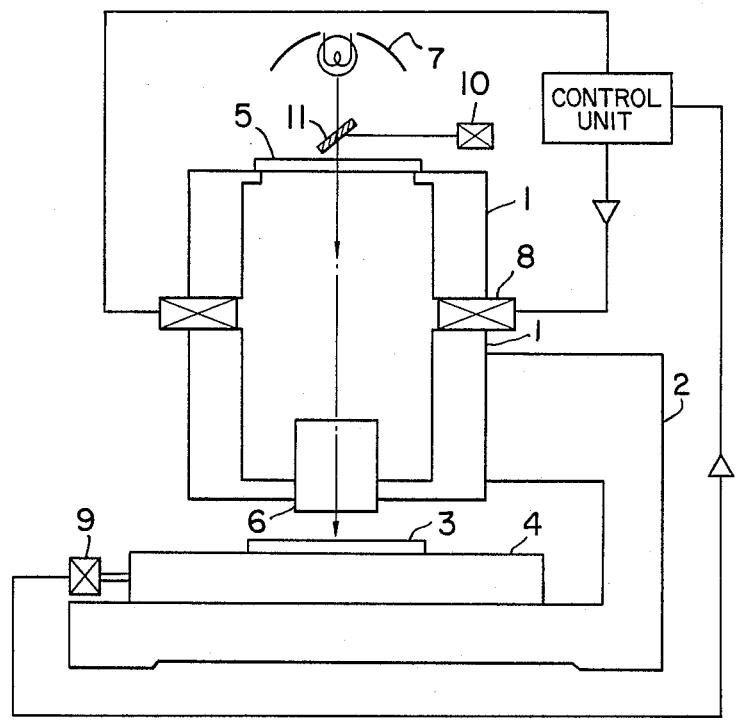
FIG. 5 shows a second embodiment of a pattern transfer device in accordance with the present invention.

A second embodiment of a pattern transfer device in accordance with the present invention is shown in FIG. 5. A lens barrel 1 is mounted on a stand 2 and a main table 4 upon which is mounted a semiconductor wafer 3 is disposed below the stand 2. An original 5 is mounted at the lens barrel 1 while the projection lens 6 is mounted at the lower end of the lens barrel 1. A light source 7 is disposed upwardly of the original 5 and a movable mirror 11 is interposed between the original 5 and the light source 7 so that the pattern on the semiconductor wafer 3 may be directed toward a pattern position detector 10. A laser interferometer 9 is mounted on the main table 4 so that the position may be detected. The control mechanism 8 for making the fine adjustment of the rate of reduction is interposed between the upper and lower halves of the lens barrel 1 so that the length of the lens barrel 1 can be varied. The control mechanism 8 may be a piezoelectric element or a motor and cam link as described before.

Figure 6A:
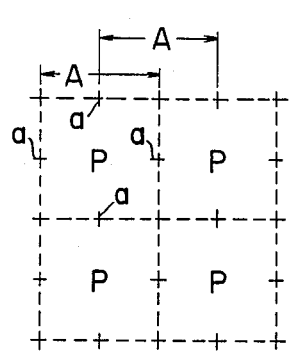
FIGS. 6(a), 6(b) and 6(c) are top views of semiconductor wafers upon which are transferred patterns by the device as shown in FIG. 5.
Figure 6B:
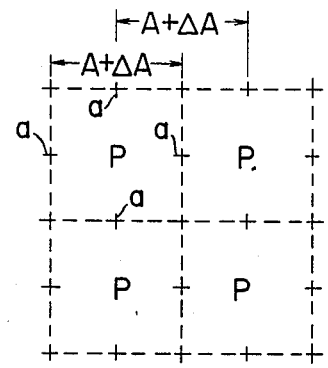
Figure 6C:
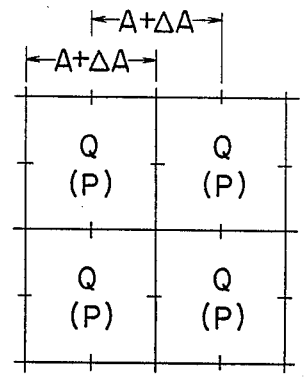

Next referring to FIGS. 6(a), 6(b) and 6(c), the mode of operation will be described. First the movable mirror 11 is moved out of the optical path from the light source 7 to the original 5 and a pattern P is transferred. That is, the light is projected from the light source 7 to the original 5 so that a reduced pattern is focused on the semiconductor wafer 3 through the projection lens 6. The main table 4 is stepped by a distance A and another pattern P is transferred on the semiconductor wafer 3. When the semiconductor wafer 3 is subjected to a heat treatment step, it is expanded so that a pattern P is enlarged as indicated at (b) in FIG. 6. As a result, the step is increased from A to $A+\Delta A$. Thereafter a reduced pattern Q is superimposed on the pattern P. First, the movable mirror 11 is moved to the position shown in FIG. 5 so that the pattern transferred on the semiconductor wafer 3 is received or detected by the pattern position detector 10. The pattern position detector 10 detects the alignment mark a of the pattern P so that the expanded step $A+\Delta A$ can be detected. An extremely small "deviation" $\Delta A$ can be detected by the high precision laser interferometer 9 mounted on the main table 4. Thereafter, the transfer reduction of a pattern Q is computed by a control system. The reduction ratio $N_A+\Delta N$ of the pattern Q can be obtained from the following equation:

$$N_A+\Delta A=N_A(A+\Delta A/A)=N_A\pm(\Delta A/A)N_A$$

where $N_A$ is the reduction ratio when the step is A. The control mechanism 8 is so operated that the length of the lens barrel 1 is varied and consequently the transfer reduction ratio becomes $N_A+\Delta N$. Thereafter the movable mirror 11 is moved out of the optical path from the light source 7 to the original 5 and the pattern Q is transferred at the reduction ratio of $N_A+\Delta N$. The next pattern Q is transferred in a manner substantially similar to that described above. That is, the step is detected from the alignment marks a of the pattern P and in response to the detected step, the reduction ratio is corrected and then the pattern Q is transferred. In like manner, the patterns Q are successively transferred as shown in FIG. 6(c).

According to the second embodiment, even when the semiconductor wafer is expanded or shrinked, the patterns may be transferred by minimum misalignment or misregistration. Especially, according to the second embodiment, after the transferred pattern has been measured, the reduction ratio is varied so that the correct alignment between the patterns P and Q can be ensured even when the semiconductor wafer is locally deformed.

In the first embodiment, the transfer reduction ratio is varied every time when a pattern is transferred, but it is to be understood that the steps between typical points on the semiconductor wafer are measured and the average step is obtained so that the reduction ratio can be determined in response to the average step.

It is to be understood that various modifications can be effected within the scope of the present invention and that the present invention is not limited to the control mechanism 8, the laser interferometer 9 and the pattern position detector 10 described above. Furthermore a pattern may be transferred not only on the surface of a semiconductor wafer but also on a semiconductor mask or the like.

TECHNICAL ADVANTAGES OF THE INVENTION

As described above, according to the present invention a prior art device and method for transferring patterns over the surface of a photomask or a semiconductor wafer by the step-and-repeat procedure and by reducing the original pattern is provided with a reduction control means for making the fine adjustment of the reduction so that the size of each pattern can be corrected. Therefore even when a wafer is deformed or shrinked due to heat treatment, not only the step can be corrected but also the size of a pattern can be adjusted so that the misalignment between the patterns can be reduced to a minimum. For instance, if a pattern consisting of 10×10 elements (patterns) is enlarged by 1 micrometer per 100 millimeter, each element (pattern) is corrected by 0.1 micrometer per 10 millimeter. Then, the most influential cause of the primary misalignment between the patterns can be removed.

There is a one-to-one pattern drawing device in which the reduction is finely adjusted in order to remove the inherent errors. As a result, the reduction cannot be varied in response to the external inputs, the shrinkage of a wafer and so on so that the device cannot obtain the effect that the misalignment between the patterns drawn by the step-and-repeat procedure can be eliminated as the present invention. Each pattern transfer device has its own temperature so that it has been considered that it is impossible to transfer patterns on a wafer or the like without any misalignment or misregistration with different pattern transfer devices. However, according to the present invention, patterns can be transferred without any misalignment or misregistration with a plurality of pattern transfer devices.

What is claimed is:

1. A pattern transfer device comprising:
    a main table upon which is mounted an object;
    a lens barrel having a first section and a second section, one end of said first section being adapted to receive an original and a distal end of said second section being adapted to receive a high resolving power lens for focusing an image of said original on said object;
    control means for determining a dimensional variation in said object and for producing a control signal based on said dimensional variation as detected; and
    a reduction ratio adjustment means, coupled between said first and second sections and responsive to said control means, for varying the length of said lens barrel in response to said control signal to vary the size of the image focused on said object through said high resolving power lens.

2. A pattern transfer device as set forth in claim 1, wherein said reduction ratio adjustment means deforms itself in response to said control signal.

3. A pattern transfer device as set forth in claim 1, wherein said reduction ratio adjustment means comprises a piezoelectric element.

4. A pattern transfer device comprising:
    a main table upon which is mounted an object;
    a lens barrel having a first section and a second section, one end of said first section being adapted to receive an original, and a distal end of said second section having a high resolving power lens for focusing a reduced image of said original on said object;
    a pattern position detection means for detecting the position of the pattern transferred on said object and obtaining a step position error;
    control means responsive to said pattern position detection means for producing a control signal based on said step position error; and
    a reduction ratio adjustment means coupled between said first and second sections and responsive to said control means, for performing fine adjustment of the length of said lens barrel in response to said control signal, and so for changing the size of the image of said original focused through said high resolving power lens on said object.

5. A pattern transfer device as set forth in claim 5, wherein said reduction ratio adjustment means deforms itself in response to said control signal.

6. A pattern transfer device as set forth in claim 5, wherein said reduction ratio adjustment means comprises a piezoelectric element.

7. A pattern transfer method in which a pattern is reduced and transferred to an object in a step-and-repeat procedure, comprising the steps of:
    (a) obtaining a dimensional variation in the size of said object; and
    (b) performing fine adjustment of reduction of said pattern based on said dimensional variation obtained in said step (a), thereby adjusting the size of each pattern transferred on said object.

* * * * *